United States Patent
Su et al.

(10) Patent No.: US 10,763,796 B2
(45) Date of Patent: Sep. 1, 2020

(54) MILLER COMPENSATION CIRCUIT AND ELECTRONIC CIRCUIT

(71) Applicant: SMARTER MICROELECTRONICS (GUANG ZHOU) CO., LTD., Guangzhou (CN)

(72) Inventors: Qiang Su, Guangzhou (CN); Jiangtao Yi, Guangzhou (CN)

(73) Assignee: SMARTER MICROELECTRONICS (GUANG ZHOU) CO., LTD., Guangzhou (CN)

( * ) Notice: Subject to any disclaimer, the term of this patent is extended or adjusted under 35 U.S.C. 154(b) by 0 days.

(21) Appl. No.: 16/409,848

(22) Filed: May 12, 2019

(65) Prior Publication Data

US 2019/0267952 A1 Aug. 29, 2019

Related U.S. Application Data

(63) Continuation of application No. PCT/CN2017/115340, filed on Dec. 8, 2017.

(30) Foreign Application Priority Data

Dec. 8, 2016 (CN) .......................... 2016 1 1123817

(51) Int. Cl.
| | |
|---|---|
| *H03F 1/14* | (2006.01) |
| *H03F 1/38* | (2006.01) |
| *H03F 3/45* | (2006.01) |
| *G05F 1/56* | (2006.01) |

(52) U.S. Cl.
CPC ............... *H03F 1/38* (2013.01); *G05F 1/561* (2013.01); *H03F 3/45071* (2013.01); *H03F 2200/129* (2013.01); *H03F 2203/45116* (2013.01); *H03F 2203/45511* (2013.01); *H03F 2203/45512* (2013.01); *H03F 2203/45528* (2013.01); *H03F 2203/45534* (2013.01)

(58) Field of Classification Search
CPC ........ H03F 1/34; H03F 3/45; H03F 2200/147; H03F 2200/153
USPC .................................................. 330/260, 292
See application file for complete search history.

(56) References Cited

U.S. PATENT DOCUMENTS

2001/0024140 A1* 9/2001 Taylor ...................... G05F 1/56
330/292

\* cited by examiner

*Primary Examiner* — Steven J Mottola
(74) *Attorney, Agent, or Firm* — Syncoda LLC; Feng Ma

(57) ABSTRACT

A Miller compensation circuit includes: a differential amplifier having an inverse input end configured to receive an input signal; an output transistor having an output end connected to a positive input end of the differential amplifier, a first end connected to a first power supply, a second end connected to an output end of the differential amplifier, and a third end being a voltage output end and connected to the positive input end and a load; a Miller capacitor connected to the output end of the differential amplifier; a follower; and a current sampling circuit configured to sample a first current of the output transistor. The load is also connected to a second power supply.

20 Claims, 5 Drawing Sheets

MILLER COMPENSATION CIRCUIT AND ELECTRONIC CIRCUIT

CROSS-REFERENCE TO RELATED APPLICATIONS

The present application is a continuation of, and claims priority to, PCT/CN2017/115340 filed on Dec. 8, 2017, which in turn claims priority to Chinese Patent Application No. CN 201611123817.3 filed on Dec. 8, 2016. The disclosures of these applications are hereby incorporated by reference in their entirety.

BACKGROUND

Feedback loops are widely used in electronic circuits. For example, voltage regulators, phase-locked loops, and analog-to-digital converters used in industry in large scale are all implemented based on the feedback loop. However, the feedback loop is often unstable, and a feedback loop compensation circuit is often used in practice to ensure the stability of the feedback loop.

SUMMARY

The present disclosure relates to the field of electronic technologies, and in particular to a Miller compensation circuit and an electronic circuit.

A Miller compensation circuit and an electronic circuit are provided in embodiments of the present disclosure, so as to solve the problem of the poor compensation stability of the existing Miller compensation circuits.

According to a first aspect of the embodiment of the present disclosure, a Miller compensation circuit is provided, which includes: a differential amplifier, an output transistor, a Miller capacitor, a follower and a current sampling circuit.

The differential amplifier includes an inverting input terminal, a non-inverting input terminal and an output terminal. The inverting input terminal of the differential amplifier is connected to an input signal of the Miller compensation circuit, the non-inverting input terminal of the differential amplifier is connected to an output terminal of the output transistor; the output terminal of the differential amplifier is connected to the output transistor and the Miller capacitor.

The output transistor includes a first terminal, a second terminal and a third terminal. The first terminal is connected to a first power supply; the second terminal is connected to the output terminal of the differential amplifier; the third terminal is a voltage output terminal, connected to the non-inverting input terminal of the differential amplifier and configured to be connected to one terminal of a load; and another terminal of the load is connected to a second power supply.

One terminal of the Miller capacitor is connected to the output terminal of the differential amplifier, and another terminal of the Miller capacitor is connected to an output terminal of the current sampling circuit and an output terminal of the follower.

An input terminal of the follower is connected to the third terminal of the output transistor, and the output terminal of the follower is connected to the Miller capacitor and the output terminal of the current sampling circuit.

The current sampling circuit samples a first current of the output transistor to obtain a second current, and the second current is outputted from the output terminal of the current sampling circuit, where the second current and the first current satisfy a preset proportional relation.

According to a second aspect of the embodiment of the present disclosure, an electronic circuit is provided, which includes one or more of the Miller compensation circuits described above.

In the Miller compensation circuit and the electronic circuit provided in the embodiments of the present disclosure, a current sampling circuit is introduced. The current sampling circuit provides the follower with a current source, which changes with and is proportional to the current of the output transistor, by sampling the current of the output transistor, such that the transconductance of the follower changes in proportion to the change of the transconductance of the output transistor. In the prior art, a constant power supply is used to supply current for the follower, the current to the follower does not change with the current in the output transistor. In other words, while the current in the output transistor changes, which results in change of transconductance of the output transistor, the transconductance of the follower keeps constant, which causes compensation imbalance. With the embodiments of the present disclosure, the above problem of compensation imbalance is solved, and the stability in compensation and the compensation effect is improved.

DETAILED DESCRIPTION

The technical solutions of the application will be described in detail in conjunction with the accompanying drawings of the specification and specific embodiments, and it should be understood that the preferred embodiments described herein are only used for describing and explaining the present disclosure and not used for limiting the present disclosure.

The inventors of the present disclosure have recognized that the Miller compensation circuit is a general loop compensation circuit. A right-half-plane zero is introduced in the Miller compensation, which may greatly affect the stability of the feedback loop and limit the bandwidth of the feedback loop. Therefore, generally, a certain approach is employed to eliminate the right-half-plane zero or change a position of the right-half-plane zero such that it becomes a left-half-plane zero.

Figure 1:
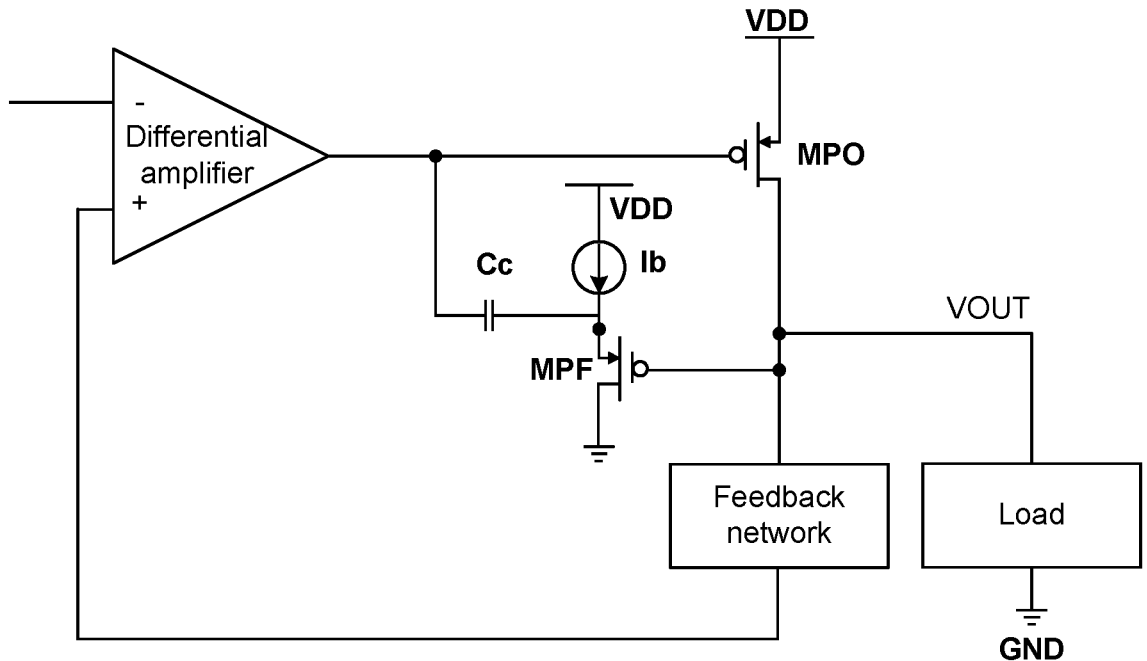
FIG. 1 is a schematic circuit diagram of a Miller compensation circuit.

FIG. 1 shows a Miller compensation feedback loop with a follower. In FIG. 1, the follower comprises a current source Ib and a P-channel MOS transistor MPF can eliminate a feedforward path of the Miller compensation, thereby eliminating the right-half-plane zero. At the same time, a new left-half-plane zero is introduced at the following position:

$$\omega_{zero} = -\frac{G_{m,MPF}}{C_c}$$

where $\omega_{zero}$ represents a position of the zero, $G_{m,MPF}$ represents a transconductance of the PMOS transistor MPF, $C_c$ represents a Miller compensation capacitor Cc. A second pole of the feedback loop is at the following position:

$$\omega_{p2} = -\frac{G_{m,MPO}}{C_L}$$

where $\omega_{p2}$ represents the position of the second pole, $G_{m,MPO}$ represents a transconductance of a PMOS output transistor MPO, $C_L$ represents a load capacitor of a load. If the second pole is utilized to compensate the left-half-plane zero, it is needed to satisfy a formula $\omega_{zero}=\alpha*\omega_{p2}$, which is equivalent to satisfy a relation of $G_{m,MPF}=\alpha*G_{m,MPO}*(C_c/C_L)$, where $\alpha$ may be a preset positive real number, thereby ensuring the stability of the feedback loop and expanding the bandwidth of the feedback loop.

However, it is difficult to satisfy the equation of $\omega_{zero}=\alpha*\omega_{p2}$ due to a problem that $G_{m,MPF}$ changes with a current of the PMOS output transistor MPO, and the equation of $G_{m,MPF}=\alpha*G_{m,MPO}*(C_c/C_L)$ cannot be satisfied for the different currents of the PMOS output transistor MPO.

Therefore, in the Miller compensation circuit according to the conventional technology, only when the current of the output transistor MPO is constant can the second pole be utilized to compensate the left-half-plane zero, and once the current of the output transistor MPO changes, compensation imbalance may appear, thus resulting in poor compensation effect, and poor stability in compensation and other problems.

Figure 2A:
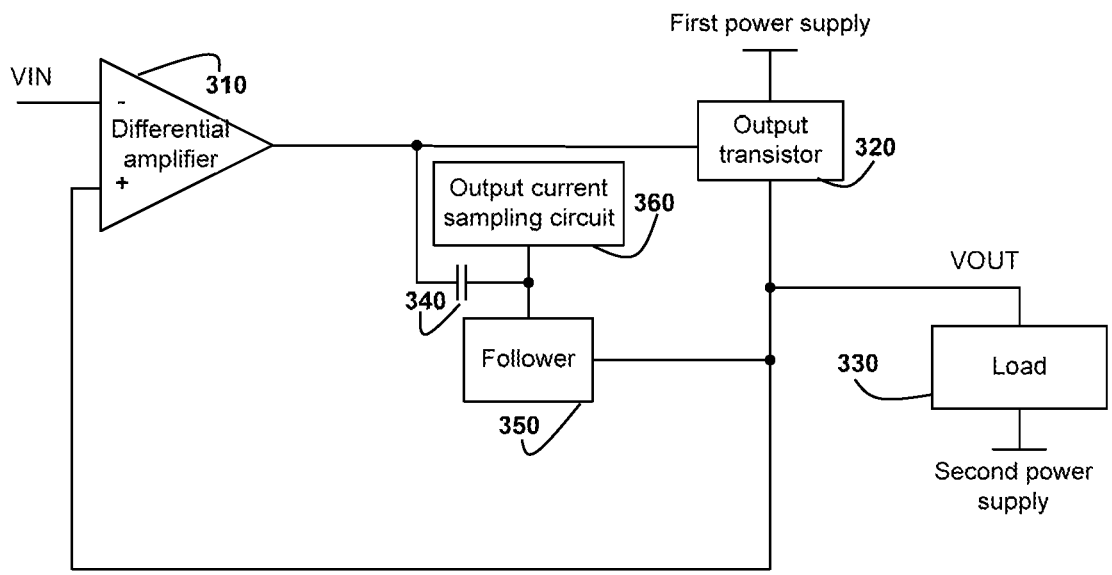
FIG. 2A is a schematic circuit diagram of a first Miller compensation circuit according to an embodiment of the present disclosure.

As shown in FIG. 2A, a Miller compensation circuit is provided in the embodiment, which includes a differential amplifier 310, an output transistor 320, a load 330, a Miller capacitor 340, a follower 350 and a current sampling circuit 360. In the embodiment, the load 330 may be a component of the Miller compensation circuit, or may not be a component of the Miller compensation circuit. In the latter case, the Miller compensation circuit may provide a connection terminal to be connected to the load 330.

The differential amplifier 310 includes an inverting input terminal, a non-inverting input terminal and an output terminal. The inverting input terminal is adapted to be connected to an input signal VIN of the Miller compensation circuit. The non-inverting input terminal is connected to an output terminal of the output transistor 320. The output terminal of the differential amplifier 310 is connected to the output transistor 320 and the Miller capacitor 340.

The output transistor 320 includes a first terminal, a second terminal and a third terminal. The first terminal is connected to a first power supply. The second terminal is connected to the output terminal of the differential amplifier 310. The third terminal is a voltage output terminal VOUT, and is connected to the non-inverting input terminal of the differential amplifier 310 and is adapted to be connected to the load 330. One terminal of the load 330 is connected to the third terminal of the output transistor 320, and the other terminal of the load 330 is connected to a second power supply.

One terminal of the Miller capacitor 340 is connected to the output terminal of the differential amplifier 310, and the other terminal of the Miller capacitor 340 is connected to an output terminal of the current sampling circuit 360 and an output terminal of the follower 350.

An input terminal of the follower 350 is connected to the third terminal of the output transistor 320, and the output terminal of the follower 350 is connected to the Miller capacitor 340 and the output terminal of the current sampling circuit 360.

The current sampling circuit 360 samples a first current of the output transistor 320 to obtain a second current, and the second current is outputted from the output terminal of the current sampling circuit 360. The second current and the first current satisfy a preset proportional relation.

Figure 2B:
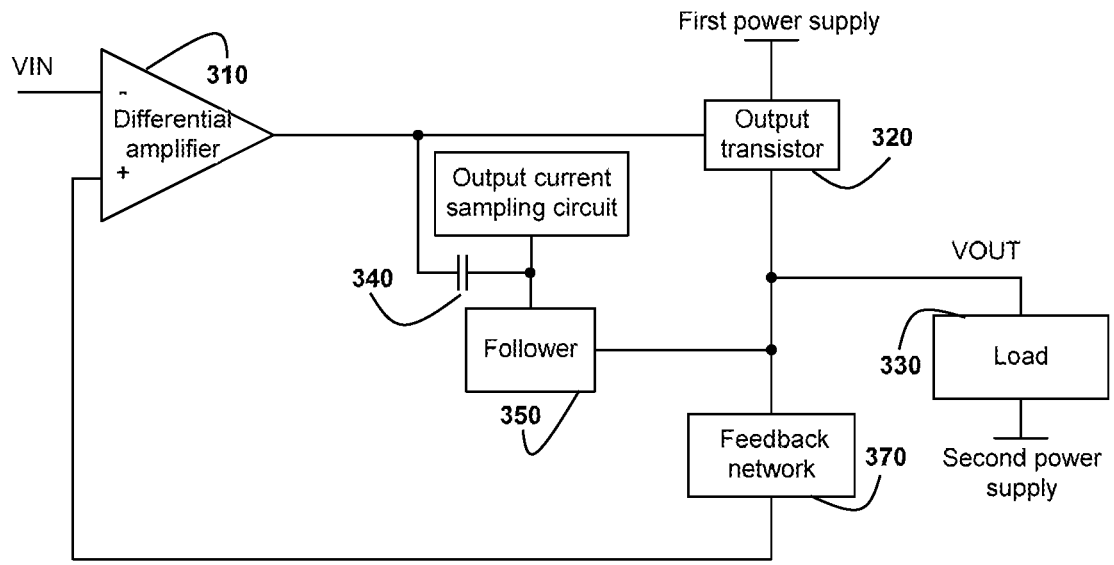
FIG. 2B is a schematic circuit diagram of a second Miller compensation circuit according to an embodiment of the present disclosure.

In the Miller compensation circuit provided in the embodiment, the circuit current sampling circuit is introduced. According to one aspect, the current sampling circuit may, on one hand, collect the current of the output transistor 320, and on other hand, form the second current based on the collected first current. The proportional relation between the second current and the first current always satisfies the preset proportional relation. For example, a ratio of the first current to the second current is always equal to a preset value. In this way, when the first current changes, the second current changes proportionally, i.e., the second current may change with the first current. The transconductance of each of the output transistor 320 and the follower 350 is positively correlated with the current of a respective one of the output transistors 320 and the follower 350. The first current is the current of the output transistor 320, and the second current is the current of the follower 350. It is apparent that the change of the current of the follower 350 is proportional to that of the current of the output transistor 320, and the transconductance of the output transistor 320 and the transconductance of the follower 350 change synchronously. Therefore, the Miller compensation circuit provided in the embodiment solves the problem of compensation imbalance caused by out of sync between the transconductance of the output transistor 320 and the transconductance of the follower 350 in the case that the current of the follower does not change with the current of the output transistor 320. Accordingly, the instability in compensation caused by current drift of the output transistor 320 is eliminated In some embodiments, as shown in FIG. 2B, the Miller compensation circuit further includes a feedback network 370.

The third terminal of the output transistor 320 is connected to the non-inverting terminal of the differential amplifier 310 via the feedback network 370.

The Miller compensation circuit provided in the embodiment further includes the feedback network. The feedback network 370 may include multiple electronic elements, and may be an active network or a passive network. The introduction of the feedback network may allow adjustment of a voltage inputted to the non-inverting terminal of the differential amplifier 310 from a voltage output terminal of the output transistor 320 by adjusting a circuit structure between the input terminal and the output terminal of the feedback network, thereby satisfying different application scenarios.

For example, the feedback network may include an adjustable resistor. The non-inverting input terminal of the differential amplifier 310 is connected to an adjustable terminal of the feedback network. It is apparent that the voltage inputted to the non-inverting input terminal of the differential amplifier may be adjusted by adjusting a position of the adjustable terminal. Of course, the differential amplifier 310 may further include multiple impedance elements connected in series and/or in parallel, the voltage inputted to the non-inverting input terminal of the differential amplifier 301 may be adjusted by adjusting an impedance of at least one of the impedance elements and/or a connection relation (s) between at least some of the impedance elements.

Figure 2C:
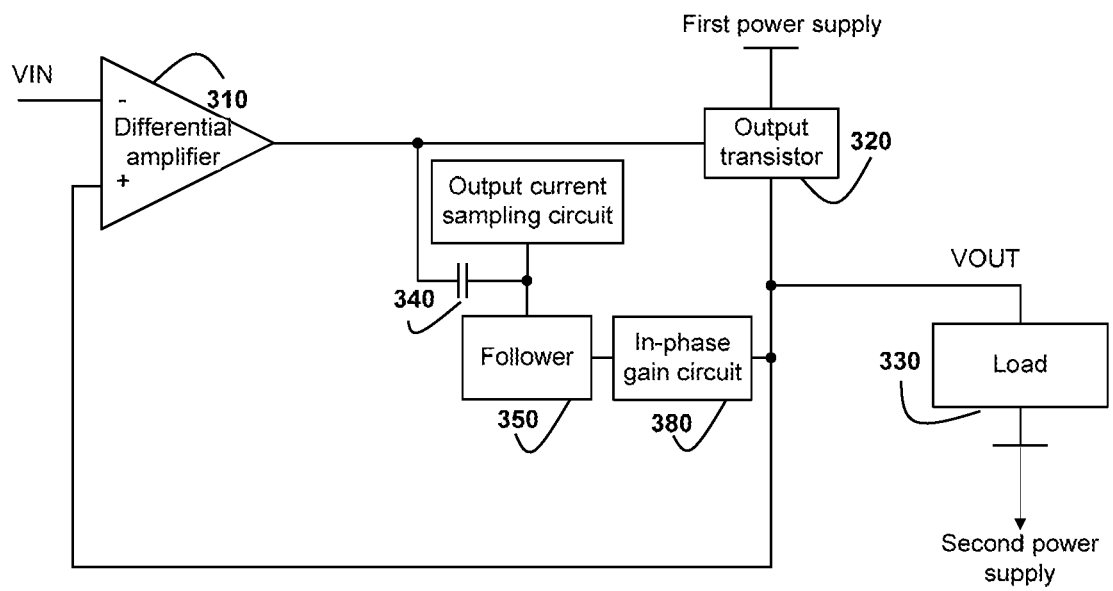
FIG. 2C is a schematic circuit diagram of a third Miller compensation circuit according to an embodiment of the present disclosure.

In some embodiments, as shown in FIG. 2C, the Miller compensation circuit further includes an in-phase gain circuit 380.

The follower 350 is connected to the third terminal of the output transistor 320 via the in-phase gain circuit 380.

The third terminal of the output transistor is the voltage output terminal. In the embodiment, the in-phase gain circuit 380 is connected between the follower 350 and the third terminal of the output transistor 320. The in-phase gain circuit 380 may be a circuit for performing signal amplification without changing a phase of an alternative current signal. In the embodiment, the introduction of the in-phase gain circuit 380 may ensure negative feedback of the Miller compensation, thereby ensuring the stability of the Miller compensation circuit; and a gain of the Miller compensation negative feedback loop may be changed by adjusting a gain of the in-phase gain circuit 380, so as to satisfy different operation situations.

For example, a gain amplitude of the gain circuit is more than 0, and the gain amplitude may be equal to 0.5, 1.5, 2, 3 or other values.

In the embodiment, the output transistor 320 is a Metal-Oxide-Semiconductor Field-Effect-Transistor (MOSFET) or a bipolar transistor.

MOS transistors may be categorized as PMOS transistors with a N-type substrate and a P-type channel, and NMOS transistors with a P-type substrate and a N-type channel. The N-type substrate, the P-type channel, the P-type substrate and the N-type channel are all used for describing charge properties of corresponding component materials. Reference may be made to the prior art for details, which will not be repeated herein.

Bipolar transistors may be categorized as NPN-type bipolar transistors and PNP-type bipolar transistors.

The output transistor 320 provided in the embodiment may be any one of the above transistors.

The follower 350 provided in the embodiment may include at least one transistor. Of course, the follower 350 may further include one or more linear elements connected to the transistor, such as resistors. Of course, the follower 350 may further include multiple cascaded transistors. The follower may have various structures as long as the transconductance of the follower 350 is positively correlated to the current of the follower 350.

In the embodiment, the transistor included in the follower 350 may be an MOS transistor or a bipolar transistor. In general, the MOS transistor here may be an NMOS transistor or a PMOS transistor; the bipolar transistor may be a PNP-type bipolar transistor or an NPN-type bipolar transistor.

In order to ensure that the transconductance of the follower 350 changes in proportion to the change of the transconductance of the output transistor 320, in the embodiment, in a case that the output transistor is an MOS transistor, the follower includes an MOS transistor; in a case that the output transistor is a bipolar transistor, the follower includes a bipolar transistor.

In this way, transistors of the same type are used as the output transistor 320 and the follower 350, which may better ensure that the transconductance of the output transistor 320 changes in proportion to the change of the transconductance of the follower 350, thereby ensuring the compensation stability and the compensation effect. Of course, in a specific implementation, the output transistor 320 and the transistor included in the follower 350 may be of different types. In this case, different current sensitivities of the transistors of different types should be taken into consideration in design of the circuit with the transistors. Other electronic elements may be desired to keep the stability. For example, non-linear elements may be provided to be connected to the transistors, to achieve the proportional change. Of course, even if using transistors of different types, it is also feasible to ensure the transconductance of each of the transistors changes in proportion to the change of the current based on parameters of the transistors of different types. For example, transistors of different types meeting the following condition may be used, i.e., a product of a mobility, an aspect ratio and a gate dielectric capacitance per unit area of each of the transistors is to be equal to each other.

In some embodiments, in a case that the first power supply is a positive power supply, the second power supply is a zero-power supply.

In a case that the second power supply is a positive power supply, the first power supply is a zero-power supply.

In the embodiment, the zero-power supply may be a ground point connected to a ground point or a ground power supply. Of course, in the embodiment, the zero-power supply may be a reference power supply, the positive power supply is a power supply that provides a voltage higher than the zero-power supply. In the embodiment, the zero-power supply is used as the ground, which may reduce the voltage to be provided by the positive power supply, such that the requirement for the positive power supply is reduced, and power amount consumed by the circuit is reduced.

An electronic circuit is further provided in the embodiment, which may include any one of the above Miller compensation circuits. The electronic circuit further includes other electronic modules, which may be connected to the inverting input terminal of the differential circuit and configured to provide the VIN, or may be connected to the third terminal of the output transistor 320 and configured to receive a VOUT outputted from the third terminal. In general, because of including any one of the above Miller compensation circuits, the electronic circuit provided in the embodiment is stable in Miller compensation, and thus has a reduced number of various circuit operation abnormalities caused by instability in the Miller compensation.

Several specific examples are provided herein in conjunction with the above embodiments.

Figure 3:
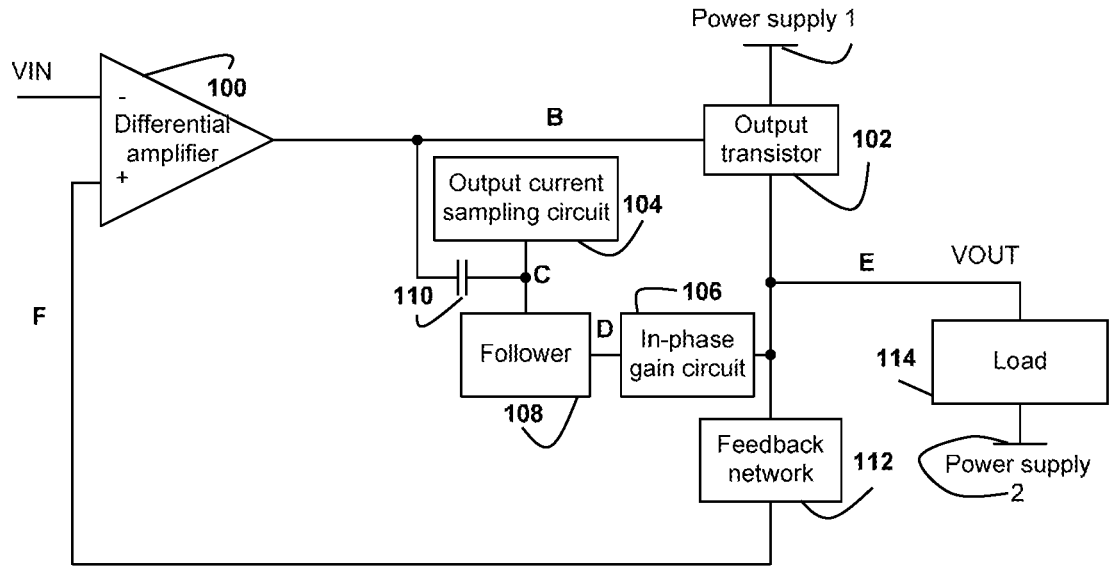
FIG. 3 is a schematic circuit diagram of a fourth Miller compensation circuit according to an embodiment of the present disclosure.

As shown in FIG. 3, a Miller compensation circuit is provided in a first example, which includes: a differential amplifier 100, an output transistor 102 and a feedback network 112. In some cases, the Miller compensation circuit may further include a load 114, and in other cases, the load 114 may not be directly introduced in the Miller compensation circuit, and the Miller compensation circuit provides a connection point to be coupled by the load 114.

An inverting input terminal of the differential amplifier 100 is connected to an input signal VIN, a non-inverting input terminal F of the differential amplifier 100 is connected to an output of the feedback network 112, an output terminal of the differential amplifier 100 is connected to an input terminal B of the output transistor 102, a second terminal E of the output transistor 102 is connected to an output VOUT, a third terminal of the output transistor 102 is connected to a power supply 1, an input terminal of the feedback network 112 is connected to the output VOUT, the load 114 is connected between the output VOUT and a power supply 2. The Miller compensation circuit includes an in-phase gain circuit 106. An input of the in-phase gain circuit is connected to a node E, an output of the in-phase gain circuit is connected to a node D, a small signal gain from the input to the output is A, A is a positive real. The Miller compensation circuit includes a follower 108. An input of the follower 108 is connected to the node D, an output of the follower 108 is connected to a node C. The Miller compensation circuit includes an output current sampling circuit 104. The output current sampling circuit samples a current of the output transistor 102, thereby obtaining a current ISNS proportional to a current IO of the output transistor, where ISNS=IO/M, M is a preset real, the current ISNS flows into the node C. The Miller compensation circuit includes a capacitor 110. One terminal of the capacitor 110 is connected to a node B, the other terminal of the capacitor 110 is connected to the node C, and the capacitor 110 acts as a Miller capacitor. The Miller compensation circuit includes a power supply 1 and a power supply 2. One of the power supplies 1 and the power supply 2 is a positive power supply, and the other one is one of a zero power supply and ground GND. In other words, in a case that the power supply 1 is a positive power supply, the second power supply 2 is a zero-power supply; or in a case that the power supply 1 is a zero-power supply, the power supply 2 is a positive power supply.

Figure 4:
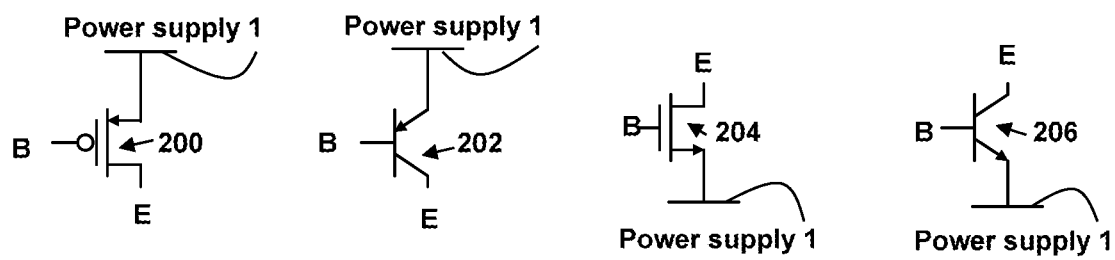
FIG. 4 is schematic circuit diagrams of four optional output transistors according to an embodiment of the present disclosure.

As shown in FIG. 4, the output transistor 102 may be implemented as a PMOS transistor 200, a PNP transistor 202, a NMOS transistor 204 or an NPN transistor 206. In a case that the output transistor 102 is implemented as the PMOS transistor 200, a second pole of the feedback loop is as follows:

$$\omega_{p2} = -\frac{A*G_{m,200}}{C_L}$$

$$G_{m,200} = \sqrt{2\mu_p C_{ox,200}\left(\frac{W}{L}\right)_{200} IO}$$

where $G_{m,200}$ represents at transconductance of the PMOS transistor 200, $\mu_p$ represents a mobility of the PMOS transistor, $C_{ox,200}$ represents a gate dielectric capacitance per unit area, $$\left(\frac{W}{L}\right)_{200}$$

represents an aspect ratio of the PMOS transistor 200.

In a case that the output transistor 102 is implemented as the PNP transistor 202, the second pole of the feedback loop is as follows:

$$\omega_{p2} = -\frac{A*G_{m,202}}{C_L}$$

$$G_{m,202} = \frac{IO}{Vt}$$

where $G_{m,202}$ represents a transconductance of the PNP transistor 202, Vt represents a thermal voltage. In a case that the output transistor 102 is implemented as the NMOS transistor 204, the second pole of the feedback loop is as follows:

$$\omega_{p2} = -\frac{A*G_{m,204}}{C_L}$$

$$G_{m,204} = \sqrt{2\mu_n C_{ox,204}\left(\frac{W}{L}\right)_{204} IO}$$

where $G_{m,204}$ represents a transconductance of the NMOS transistor 204, $\mu_n$ represents a mobility of the NMOS transistor, $C_{ox,204}$ represents a gate dielectric capacitance per unit area, $$\left(\frac{W}{L}\right)_{204}$$

represents an aspect ratio of the NMOS transistor 204.

In a case that the output transistor 102 is implemented as the NPN transistor 206, the second pole of the feedback loop is as follows:

$$\omega_{p2} = -\frac{A*G_{m,206}}{C_L}$$

$$G_{m,206} = \frac{IO}{Vt}$$

where $G_{m,206}$ represents a transconductance of the NPN transistor 206.

Figure 5:
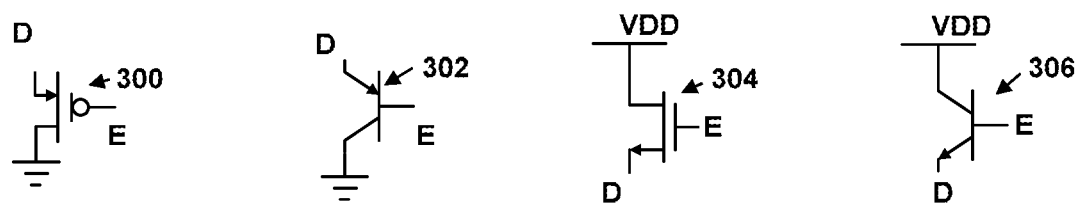
FIG. 5 is schematic circuit diagrams of transistors included in four followers according to an embodiment of the present disclosure.

As shown in FIG. 5, the follower 108 may be implemented as a PMOS transistor 300, a PNP transistor 302, a NMOS transistor 304 or an NPN transistor 306.

In a case that the follower 108 is implemented as the PMOS transistor 300, a left-half-plane zero of the feedback loop is as follows:

$$\omega_{zero} = -\frac{A*G_{m,300}}{C_c}$$

$$G_{m,300} = \sqrt{2\mu_p C_{ox,300}\left(\frac{W}{L}\right)_{300} \frac{IO}{M}}$$

where $G_{m,300}$ represents a transconductance of the PMOS transistor 300, $$\left(\frac{W}{L}\right)_{300}$$

represents an aspect ratio of the PMOS transistor 300, $C_{ox,300}$ represents a gate dielectric capacitance per unit area of the PMOS transistor 300, M is a preset proportionality coefficient.

In a case that the follower 108 is implemented as the PNP transistor 302, the left-half-plane zero of the feedback loop is as follows:

$$\omega_{zero} = -\frac{A*G_{m,302}}{C_c}$$

$$G_{m,302} = \frac{IO}{M*Vt}$$

where $G_{m,302}$ represents a transconductance of the PNP transistor 302.

In a case that the follower 108 is implemented as the NMOS transistor 304, the left-half-plane zero of the feedback loop is as follows:

$$\omega_{zero} = -\frac{A*G_{m,304}}{C_c}$$

$$G_{m,304} = \sqrt{2\mu_n C_{ox,304}\left(\frac{W}{L}\right)_{304}\frac{IO}{M}}$$

where $G_{m,304}$ represents a transconductance of the NMOS transistor 304, $\mu_n$ represents a mobility of the NMOS transistor, $$\left(\frac{W}{L}\right)_{304}$$

represents an aspect ratio of the NMOS transistor 304, $C_{ox,304}$ represents a gate dielectric capacitance per unit area of the NMOS transistor 304.

In a case that the follower 108 is implemented as the NPN transistor 306, the left-half-plane zero of the feedback loop is as follows:

$$\omega_{zero} = -\frac{A*G_{m,306}}{C_c}$$

$$G_{m,306} = \frac{IO}{M*Vt}$$

where $G_{m,306}$ represents a transconductance of the NPN transistor 306.

Since the left-half-plane zero $\omega_{zero}$ and the second pole $\omega_{p2}$ of the feedback loop increase with increase of the current IO of the output transistor, and decrease with decrease of the current IO of the output transistor, and a change coefficient of each of the left-half-plane zero $\omega_{zero}$ and the second pole $\omega_{p2}$ is independent of the current IO of the output transistor, and therefore mutual compensation between the left-half-plane zero $\omega_{zero}$ and the second pole $\omega_{p2}$ may be ensured when the current IO of the output transistor changes, thereby solving the problem of compensation imbalance caused by the change of the transconductance of the transistor with the current.

Figure 6:
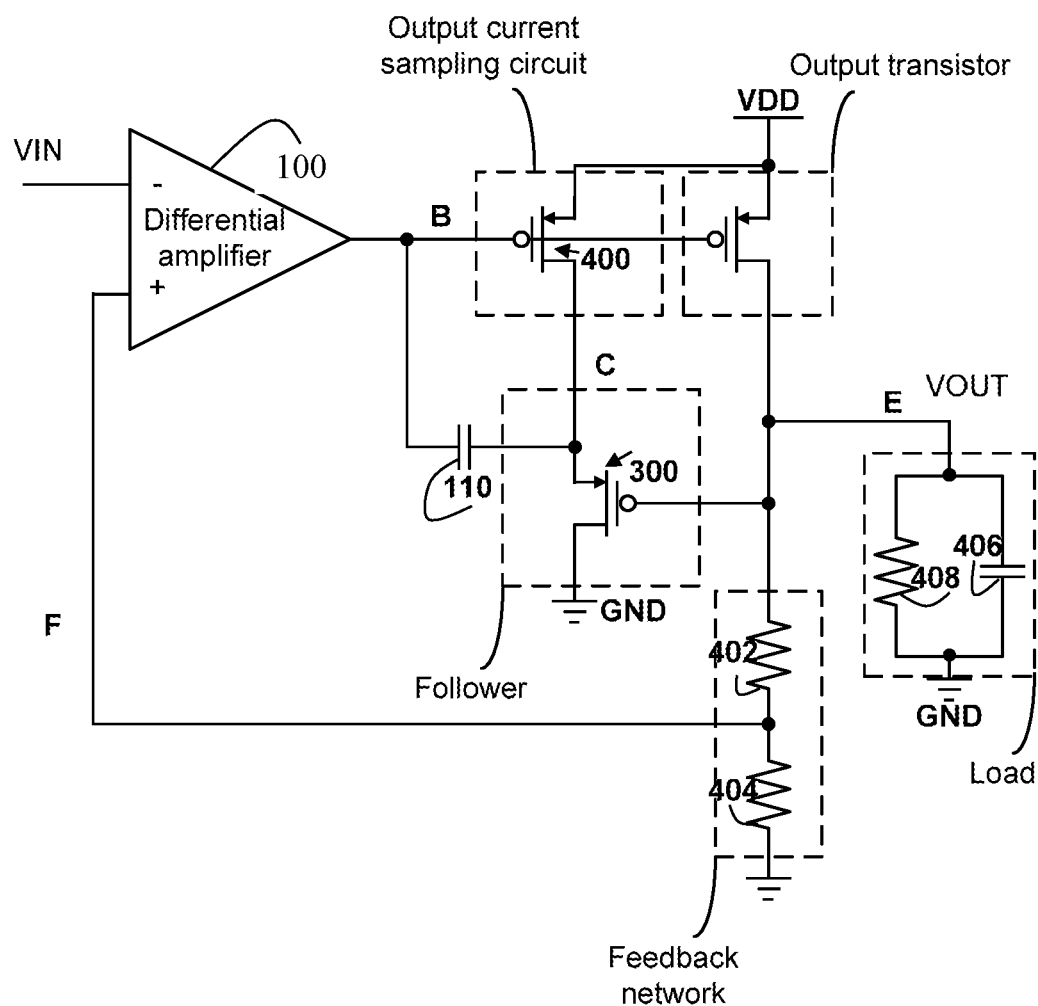
FIG. 6 is a schematic structural diagram of a fifth Miller compensation circuit according to an embodiment of the present disclosure.

As shown in FIG. 6, a Miller compensation circuit is provided in a second example. The output transistor is implemented as a PMOS transistor 200; the follower is implemented as a PMOS transistor 300. The PMOS transistor 400 forms an output current sampling circuit, a drain current of the PMOS transistor 400 is a sampling current ISNS. A resistor 402 and a resistor 404 form a feedback circuit, an output node E is an input of the feedback circuit, a node F is an output of the feedback circuit. A resistor 408 and a resistor 406 form the load. An input terminal and an output terminal of the in-phase gain circuit are shorted, and thus the small signal gain A from the input to the output is equal to 1. The second pole of the feedback circuit is as follows:

$$\omega_{p2} = -\frac{A*G_{m,200}}{C_L} = \frac{A*\sqrt{2\mu_p C_{ox,200}\left(\frac{W}{L}\right)_{200} IO}}{C_L}$$

the left-half-plane zero of the feedback loop is as follows:

$$\omega_{zero} = -\frac{A*G_{m,300}}{C_c} = \frac{A*\sqrt{2\mu_p C_{ox,300}\left(\frac{W}{L}\right)_{300}\frac{IO}{M}}}{C_c}$$

based on an equation $\omega_{zero}=\alpha*\omega_{p2}$, a following equation is obtained:

$$\left(\frac{W}{L}\right)_{300} = \left(\alpha\frac{C_c}{C_L}\right)^2 * M * \left(\frac{W}{L}\right)_{200}.$$

This equation is independent of the current IO of the output transistor. and therefore the mutual compensation between the left-half-plane zero $\omega_{zero}$ and the second pole $\omega_{p2}$ may be ensured when the current of the output transistor changes, thereby solving the problem of compensation failure caused by the change of the transconductance of the transistor with the current.

Figure 7:
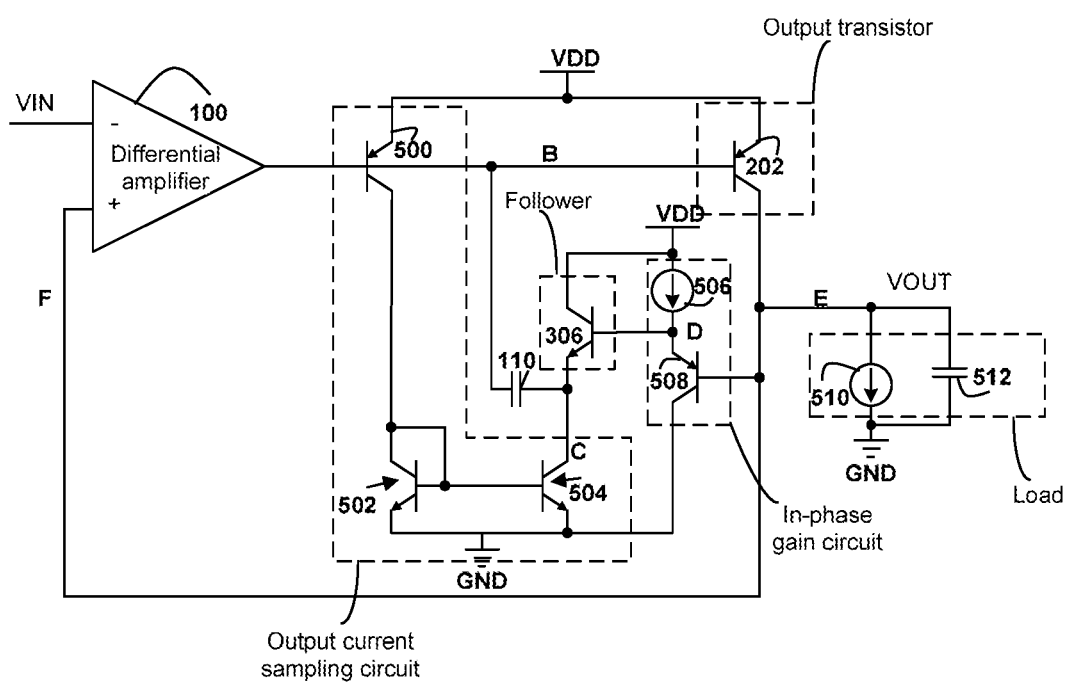
FIG. 7 is a schematic structural diagram of a sixth Miller compensation circuit according to an embodiment of the present disclosure.

As shown in FIG. 7, another Miller compensation circuit is provided in a third example. The output transistor is implemented as a PNP transistor 202, the follower is implemented as an NPN transistor 306. The PNP transistor 500, the NPN transistor 502 and the NPN transistor 504 form the output current sampling circuit, a collector current of the NPN transistor 504 is the sampling current ISNS. A current source 506 and the PNP transistor 508 form the in-phase gain circuit, the small signal gain A from the input to the output is equal to 1. The current source 510 and the capacitor 512 form the load. The input terminal and the output terminal of the in-phase gain circuit are shorted. The second pole of the feedback circuit is as follows:

$$\omega_{p2} = -\frac{A*G_{m,202}}{C_L} = -\frac{A*IO}{C_L*Vt}$$

the left-half-plane zero of the feedback loop is as follows:

$$\omega_{zero} = -\frac{A*G_{m,306}}{C_c} = \frac{A*IO}{C_c*Vt*M}$$

based on an equation $\omega_{zero}=\alpha*\omega_{p2}$, a following equation is obtained:

$$\alpha=M$$

This equation is independent of the current IO of the output transistor, therefore the mutual compensation between the left-half-plane zero $\omega_{zero}$ and the second pole $\omega_{p2}$ may be ensured when the current IO of the output transistor changes, thereby solving the problem of compensation failure caused by the circuit of the output transistor.

It should be noted that in FIGS. 1 to 7 provided by the present disclosure, VDD generally denotes a power supply, which, however, does not imply that a same power supply or a power supply of a same voltage or a same current is provided throughout FIGS. 1 to 7; and GND denotes ground.

The disclosed above is only few specific embodiments, and the protection scope of the present disclosure is not limited to the above embodiments. Any modification based on the principle of the present disclosure should fall in the protection scope of the present disclosure.

In the Miller compensation circuit and the electronic circuit provided in the embodiments of the present disclosure, the current sampling circuit is introduced. The current sampling circuit provides the follower with a current source, which changes with and is proportional to the current of the output transistor, by sampling the current of the output transistor, such that the transconductance of the follower changes in proportion to the change of the transconductance of the output transistor. Therefore, the problem of compensation imbalance caused by using a constant power supply is solved, and the stability in compensation is improved, resulting in a positive industrial effect. Moreover, the above industrial effect and strong enablement in the industry are achieved through introduction of the current sampling circuit and simple improvement in design of the circuit.

The invention claimed is:

1. A Miller compensation circuit, comprising: a differential amplifier, an output transistor, a Miller capacitor, a follower and a current sampling circuit; wherein:
   the differential amplifier comprises: an inverting input terminal, a non-inverting input terminal and an output terminal, wherein the inverting input terminal of the differential amplifier is connected to an input signal of the Miller compensation circuit, the non-inverting input terminal of the differential amplifier is connected to an output terminal of the output transistor, and the output terminal of the differential amplifier is connected to the output transistor and the Miller capacitor;
   the output transistor comprises a first terminal, a second terminal and a third terminal; wherein the first terminal is connected to a first power supply; the second terminal is connected to the output terminal of the differential amplifier; the third terminal is a voltage output terminal, connected to the non-inverting input terminal of the differential amplifier and to one terminal of a load; another terminal of the load is connected to a second power supply;
   one terminal of the Miller capacitor is connected to the output terminal of the differential amplifier, and another terminal of the Miller capacitor is connected to an output terminal of the current sampling circuit and an output terminal of the follower;
   an input terminal of the follower is connected to the third terminal of the output transistor, and the output terminal of the follower is connected to the Miller capacitor and an output terminal of the current sampling circuit;
   the current sampling circuit is configured to sample a first current of the output transistor to obtain a second current, and the second current is outputted from the output terminal of the current sampling circuit, wherein the second current and the first current satisfy a preset proportional relation.

2. The Miller compensation circuit according to claim 1, further comprising:
   a feedback network; wherein
   the third terminal of the output transistor is connected to the non-inverting input terminal of the differential amplifier via the feedback network.

3. The Miller compensation circuit according to claim 2, further comprising:
   an in-phase gain circuit; wherein
   the follower is connected to the third terminal of the output transistor via the in-phase gain circuit.

4. The Miller compensation circuit according to claim 3, wherein
   a gain amplitude of the gain circuit is more than zero.

5. The Miller compensation circuit according to claim 2, wherein
   the output transistor comprises a Metal-Oxide-Semiconductor Field-Effect-Transistor (MOSFET) or a bipolar transistor.

6. The Miller compensation circuit according to claim 5, wherein
   in case that the output transistor is the MOSFET, the follower comprises an MOS transistor; or
   in case that the output transistor is the bipolar transistor, the follower comprises a bipolar transistor.

7. The Miller compensation circuit according to claim 2, wherein
   in case that the first power supply is a positive power supply, the second power supply is a zero-power supply;
   in case that the second power supply is a positive power supply, the first power supply is a zero-power supply.

8. The Miller compensation circuit according to claim 2, wherein
   the follower comprises an MOSFET or a bipolar transistor.

9. The Miller compensation circuit according to claim 6, wherein:
   the output transistor is a PMOS transistor; and
   a second pole of a feedback loop of the Miller compensation circuit is as follows:

$$\omega_{p2} = -\frac{A * G_{m,200}}{C_L}$$

$$G_{m,200} = \sqrt{2\mu_p C_{ox,200} \left(\frac{W}{L}\right)_{200} IO}$$

where $G_{m,200}$ represents a transconductance of the PMOS transistor, $\mu_p$ represents a mobility of the PMOS transistor, $C_{ox,200}$ represents a gate dielectric capacitance per unit area, $$\left(\frac{W}{L}\right)_{200}$$

represents an aspect ratio of the PMOS transistor.

10. The Miller compensation circuit according to claim 6, wherein:
    the output transistor is a PNP transistor, a second pole of a feedback loop of the Miller compensation circuit is as follows:

$$\omega_{p2} = -\frac{A*G_{m,202}}{C_L}$$

$$G_{m,202} = \frac{IO}{Vt}$$

where $G_{m,202}$ represents a transconductance of the PNP transistor, Vt represents a thermal voltage.

11. The Miller compensation circuit according to claim 6, wherein:
the output transistor is a NMOS transistor, a second pole of a feedback loop of the Miller compensation circuit is as follows:

$$\omega_{p2} = -\frac{A*G_{m,204}}{C_L}$$

$$G_{m,204} = \sqrt{2\mu_n C_{ox,204} \left(\frac{W}{L}\right)_{204} IO}$$

where $G_{m,204}$ represents a transconductance of the NMOS transistor, $\mu_n$ represents a mobility of the NMOS transistor, $C_{ox,204}$ represents a gate dielectric capacitance per unit area, $$\left(\frac{W}{L}\right)_{204}$$

represents an aspect ratio of the NMOS transistor.

12. The Miller compensation circuit according to claim 6, wherein:
the output transistor is an NPN transistor, a second pole of a feedback loop of the Miller compensation circuit is as follows:

$$\omega_{p2} = -\frac{A*G_{m,206}}{C_L}$$

$$G_{m,206} = \frac{IO}{Vt}$$

where $G_{m,206}$ represents a transconductance of the NPN transistor.

13. The Miller compensation circuit according to claim 6, wherein:
the follower is implemented as a PMOS transistor; and
a left-half-plane zero of a feedback loop of the Miller compensation circuit is as follows:

$$\omega_{zero} = -\frac{A*G_{m,300}}{C_c}$$

$$G_{m,300} = \sqrt{2\mu_p C_{ox,300} \left(\frac{W}{L}\right)_{300} \frac{IO}{M}}$$

where $G_{m,300}$ represents a transconductance of the PMOS transistor, $$\left(\frac{W}{L}\right)_{300}$$

represents an aspect ratio of the PMOS transistor, $C_{ox,300}$ represents a gate dielectric capacitance per unit area of the PMOS transistor, M is a preset proportionality coefficient.

14. The Miller compensation circuit according to claim 6, wherein:
the follower is implemented as a PNP transistor; and
a left-half-plane zero of a feedback loop of the Miller compensation circuit is as follows:

$$\omega_{zero} = -\frac{A*G_{m,302}}{C_c}$$

$$G_{m,302} = \frac{IO}{M*Vt}$$

where G $G_{m,302}$ represents a transconductance of the PNP transistor.

15. The Miller compensation circuit according to claim 6, wherein:
the follower is implemented as an NMOS transistor; and
a left-half-plane zero of a feedback loop of the Miller compensation circuit is as follows:

$$\omega_{zero} = -\frac{A*G_{m,304}}{C_c}$$

$$G_{m,304} = \sqrt{2\mu_n C_{ox,304} \left(\frac{W}{L}\right)_{304} \frac{IO}{M}}$$

where $G_{m,304}$ represents a transconductance of the NMOS transistor, $\mu_n$ represents a mobility of the NMOS transistor, $$\left(\frac{W}{L}\right)_{304}$$

represents an aspect ratio of the NMOS transistor, $C_{ox,304}$ represents a gate dielectric capacitance per unit area of the NMOS transistor.

16. The Miller compensation circuit according to claim 6, wherein:
the follower is implemented as an NPN transistor; and
a left-half-plane zero of a feedback loop of the Miller compensation circuit is as follows:

$$\omega_{zero} = -\frac{A*G_{m,306}}{C_c}$$

$$G_{m,306} = \frac{IO}{M*Vt}$$

where $G_{m,306}$ represents a transconductance of the NPN transistor.

17. An electronic circuit, comprising a Miller compensation circuit according to claim 1.

18. The electronic circuit of claim 17, further comprising a plurality of Miller compensation circuits.

19. The electronic circuit of claim 17, wherein the electronic circuit comprises one of a voltage regulator, a phase-locked loop, and an analog-to-digital converter.

20. The electronic circuit of claim 19, further comprising:
a feedback network, wherein the third terminal of the output transistor is connected to the non-inverting input terminal of the differential amplifier via the feedback network; and an in-phase gain circuit; wherein the follower is connected to the third terminal of the output transistor via the in-phase gain circuit;

wherein a gain amplitude of the gain circuit is more than zero.

\* \* \* \* \*